United States Patent [19]
Sato et al.

[11] Patent Number: 5,247,226
[45] Date of Patent: Sep. 21, 1993

[54] ORGANIC ELECTROLUMINESCENT DEVICE

[75] Inventors: Yoshiharu Sato, Sagamihara; Shigenori Otsuka, Omiya, both of Japan

[73] Assignee: Mitsubishi Kasei Corporation, Tokyo, Japan

[21] Appl. No.: 870,310

[22] Filed: Apr. 17, 1992

[30] Foreign Application Priority Data

Apr. 19, 1991 [JP] Japan .................................. 3-88444

[51] Int. Cl.⁵ ............................................ H05B 33/14
[52] U.S. Cl. ..................................................... 313/504
[58] Field of Search ................................ 313/504, 503

[56] References Cited

U.S. PATENT DOCUMENTS

| 4,539,507 | 9/1985 | Vanslyke et al. | |
|---|---|---|---|
| 4,720,432 | 1/1988 | Vanslyke et al. | |
| 4,769,292 | 9/1988 | Tang et al. | |
| 5,085,946 | 2/1992 | Saito et al. | 313/504 X |
| 5,093,210 | 3/1992 | Ohta et al. | 313/504 X |
| 5,104,740 | 4/1992 | Shinkai et al. | 313/504 X |
| 5,104,749 | 4/1992 | Sato et al. | 313/504 X |

FOREIGN PATENT DOCUMENTS

0399508  11/1990  European Pat. Off. .

OTHER PUBLICATIONS

Patent Abstracts of Japan, vol. 15, No. 302(C-855)(4830), Aug. 2, 1991, & JP-A-3-111484, May 13, 1991, T. Mizutani, et al., "Organic Electroluminescence Apparatus".

Patent Abstracts of Japan, vol. 15, No. 353(C-865)(4881), Sep. 6, 1991, & JP-A-3-137186, Jun. 11, 1991, Y. Mori, et al., "Organic Electric Field Luminescent Element".

*Primary Examiner*—Palmer C. Demeo
*Attorney, Agent, or Firm*—Oblon, Spivak, McClelland, Maier & Neustadt

[57] ABSTRACT

An organic electroluminescent device having an anode, an organic hole injection transport layer, an organic luminescent layer and a cathode formed sequentially in this order, wherein the organic hole injection transport layer contains a metal complex and/or a metal salt of an aromatic carboxylic acid.

11 Claims, 3 Drawing Sheets

ORGANIC ELECTROLUMINESCENT DEVICE

FIELD OF THE INVENTION

The present invention relates to an organic electroluminescent device. More particularly, it relates to a thin-film type device comprising a combination of a hole injection transport layer and a luminescent layer made of organic compounds, respectively, which is designed to emit light upon application of an electric field.

BACKGROUND OF THE INVENTION

Heretofore, it has been common that thin-film type electroluminescent devices are made of inorganic material which is obtained by doping a semiconductor of a Group II-VI compound such as ZnS, CaS or SrS with Mn or a rare earth element (such as Eu, Ce, Tb or Sm) as the luminous center. However, the electroluminescent devices prepared from such inorganic materials, have problems such that 1) alternate current driving is required (about 1 KHz), 2) the driving voltage is high (about 200 V), 3) it is difficult to obtain full coloring, and 4) the cost for peripheral driving circuits is high.

In order to overcome such problems, there have been activities, in recent years, to develop electroluminescent devices using organic materials. As the materials for the luminescent layer, in addition to anthracene and pyrene which were already known, cyanine dyes (J. Chem. Soc., Chem. Commun., 557, 1985), pyrazoline (Mol. Cryst. Liq. Cryst., 135, 355, (1986)), perylene (Jpn. J. Appl. Phys., 25, L773, (1986)) or coumarin compounds and tetraphenylbutadiene (Japanese Unexamined Patent Publication No. 51781/1982), have been reported. Further, it has been proposed to optimize the type of electrodes or to provide a hole injection transport layer and a luminescent layer composed of an organic phosphor, for the purpose of improving the injection efficiency of a carrier from the electrodes in order to increase the luminous efficiency (Japanese Unexamined Patent Publications No. 51781/1982, No. 194393/1984 and No. 295695/1988).

Further, for the purpose of improving the luminous efficiency of the device and modifying the luminescent color, it has been proposed to dope a fluorescent dye for laser, such as coumarin, using an aluminum complex of 8-hydroxyquinoline as host material (J. Appl. Phys., Vol. 65, p. 3610, 1989).

With organic electroluminescent devices heretofore disclosed, electroluminescence is brought about by recombination of injected holes and electrons. However, usually, injection of a carrier has to be conducted by overcoming an injection barrier at the interface between the anode and the organic hole injection transport layer in the case of holes, or by overcoming a barrier at the interface between the cathode and the luminescent layer in the case of electrons. Therefore, a high electric field is required for the injection. Accordingly, the driving voltage for the device is required to be high, and the luminous performance, particularly the luminous efficiency, tends to be inadequate. Further, instability of the operation due to instability of the interface is observed. Therefore, further improvements have been desired.

SUMMARY OF THE INVENTION

It is an object of the present invention to provide an organic electroluminescent device which can be driven at a low voltage.

The present invention provides an organic electroluminescent device having an anode, an organic hole injection transport layer, an organic luminescent layer and a cathode formed sequentially in this order, wherein the organic hole injection transport layer contains a metal complex and/or a metal salt of an aromatic carboxylic acid.

Namely, the present inventors have conducted extensive studies for an organic electroluminescent device which can be driven at a low voltage and as a result, have found it effective to incorporate a certain specific compound to the organic hole injection transport layer. The present invention has been accomplished on the basis of this discovery.

BRIEF DESCRIPTION OF THE DRAWINGS

Now, the organic electroluminescent device of the present invention will be described in detail with reference to the drawings.

In the accompanying drawings.

DETAILED DESCRIPTION OF THE INVENTION

Figure 1:
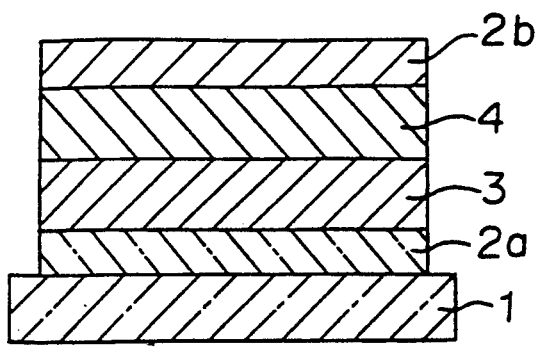
FIG. 1 is a cross sectional view showing an embodiment of the organic electroluminescent device of the present invention.

Referring to FIG. 1, reference numeral 1 indicates a substrate, numerals 2a and 2b indicate conductive layers, numeral 3 indicates an organic hole injection transport layer, and numeral 4 indicates an organic luminescent layer.

The substrate 1 constitutes a support for the electroluminescent device of the present invention and may be made of a quartz or glass sheet, a metal sheet or foil, or a plastic film or sheet However, it is preferred to employ a glass sheet or a substrate made of a transparent synthetic resin such as polyester, polymethacrylate, polycarbonate or polysulfone. On the substrate 1, a conductive layer 2a is provided Such a conductive layer 2a is usually made of a metal such as aluminum, gold, silver, nickel, palladium or tellurium, a metal oxide such as an oxide of indium and/or tin, copper iodide, carbon black or a conductive resin such as poly(3-methylthiophene).

In the embodiment of FIG. 1, the conductive layer 2a plays a hole injection role as an anode.

On the other hand, the conductive layer 2b plays a role of injecting electrons to the luminescent layer 4 as a cathode. As the material to be used as the conductive layer 2b, the same material as mentioned above with respect to the conductive layer 2a, may be employed. However, in order to promote the electron injection efficiently, it is preferred to employ a metal having a low value of work function. In this respect, a suitable metal such as tin, magnesium, indium, aluminum or silver, or their alloys may be employed.

The conductive layers 2a and 2b are usually formed by sputtering or vacuum deposition. However, in the case of fine particles of a metal such as silver, copper iodide, carbon black, fine particles of conductive metal oxide or fine conductive resin powder, such material may be dispersed in a suitable binder resin solution and coated on a substrate to form the conductive layer. Further, in the case of a conductive resin, a thin film may directly be formed on a substrate by electrolytic polymerization.

This conductive layer 2a or 2b may be made to have a multi-layered structure by depositing different types of materials among the above mentioned materials. The thickness of the conductive layer 2a varies depending upon the required transparency When transparency is required, the transmittance of visible light is usually at least 60%, preferably at least 80%. In such a case, the thickness of the conductive layer is usually from 50 to 10,000 Å, preferably from 100 to 5,000 Å. When the conductive layer 2a may be opaque, the material for the conductive layer 2a may be the same as the material for the substrate 1, or the conductive layer may be coated with a material different from the above-mentioned material for the conductive layer. On the other hand, the thickness of the conductive layer 2b is usually at the same level as the thickness of the conductive layer 2a.

Although not shown in FIG. 1, a substrate like the substrate 1 may further be provided on the conductive layer 2b. However, at least one of the conductive layers 2a and 2b is required to have good transparency for an electroluminescent device. In this respect, one of the conductive layers 2a and 2b is desired to have good transparency preferably with a thickness of from 100 to 5,000 Å.

On the conductive layer 2a, an organic hole injection transport layer 3 is formed The hole injection transport layer 3 is formed of a compound which is capable of efficiently transporting holes from the anode towards the organic luminescent layer between the electrodes to which an electric field is applied. Such a hole injection transport compound is required to be a compound having a high efficiency for injecting holes from the conductive layer 2a and being capable of efficiently transporting the injected holes. For this purpose, it is required to be a compound having a low ionization potential, large hole mobility and stability, whereby impurities likely to form traps, are scarcely formed during the preparation or use.

Such a hole injection transport compound includes, for example, those disclosed on pages 5 and 6 in Japanese Unexamined Patent Publication No. 194393/1984 and in columns 13 and 14 in U.S. Pat. No. 4,175,960. Preferred specific examples of such a compound include aromatic amine compounds such as N,N'-diphenyl-N,N'-(3-methylphenyl)-1,1'-biphenyl-4,4'-diamine, 1,1'-bis(4-di-p-tolylaminophenyl)cyclohexane, and 4,4'-bis(diphenylamino)quadrophenyl. Other than the aromatic amine compounds, hydrazone compounds as disclosed in Japanese Unexamined Patent Publication No. 311591/1990 may be mentioned. These aromatic amine compounds or hydrazone compounds may be used alone or may be used in combination as a mixture, as the case requires.

In the organic electroluminescent device of the present invention, the organic hole injection transport layer 3 made of such an organic hole injection transport compound, contains a metal complex and/or a metal salt of an aromatic carboxylic acid.

In the present invention, the aromatic carboxylic acid is preferably a compound of the following formula (I):

ArCOOH (I)

In the above formula (I), Ar is an aromatic ring or aromatic heterocyclic ring residue which may have substituents. For example, it may be an aromatic residue of e.g. benzene, naphthalene or anthracene, or an organic heterocyclic ring residue of e.g. carbazole, which may have substituents such as an alkyl group, an aryl group, a hydroxyl group, an alkoxy group, an aryloxy group, an alkylcarbonyl group, an arylcarbonyl group, an alkoxycarbonyl group, an aryloxycarbonyl group, a carboxyl group, a nitro group, a cyano group and a halogen atom. Among them, a hydroxyl group is preferred as the substituent for Ar.

Typical specific examples of the aromatic carboxylic acid of the formula (I) will be given below. However, it should be understood that the present invention is by no means restricted to such specific examples.

(Ka-1)

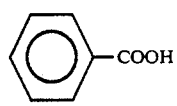
(1)

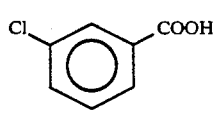
(2)

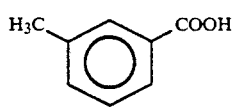
(3)

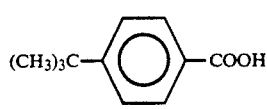
(4)

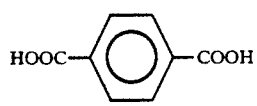
(5)

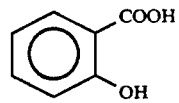
(6)

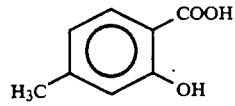
(7)

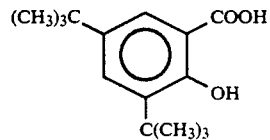
(8)

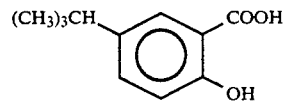
(9)

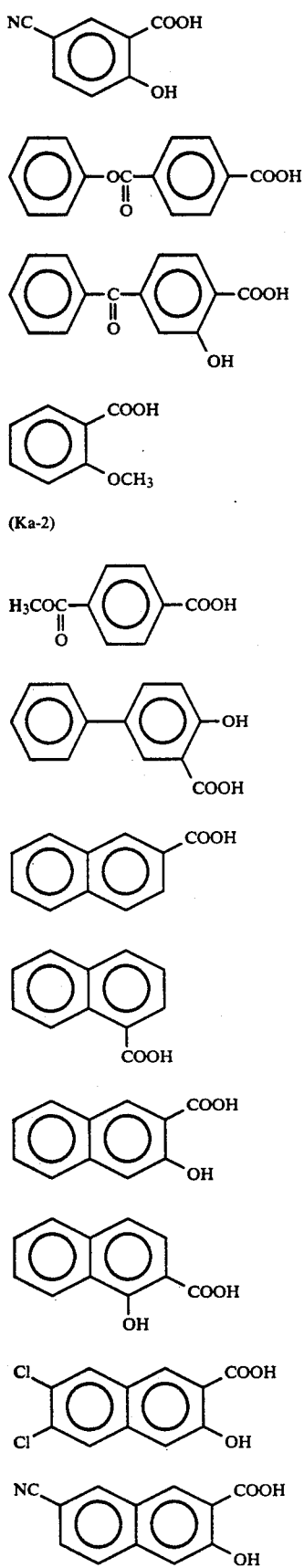

As the metal to be employed, any metal capable of forming a metal salt or a metal complex with the above aromatic carboxylic acid may be employed Particularly preferred is Al, Zn, Cr, Co, Ni or Fe.

The metal complex or the metal salt of an aromatic carboxylic acid according to the present invention, may be synthesized, for example, by a method disclosed in e.g. J. Am. Chem. Soc., Vol. 70, p 2151 (1948), Japanese Unexamined Patent Publication No. 127726/1978, No. 104940/1982, No. 42752/1980 or No. 79256/1984.

Specifically, according to J. A. Chem. Soc., Vol. 70, p 2151 (1948), a solution containing 2 mols of sodium salicylate and a solution containing 1 mol of zinc chloride are mixed and stirred at room temperature, whereby the desired product can be obtained as a white powdery zinc salt. Also in the case of other aromatic carboxylic acid or a metal other than zinc, the desired product can be prepared in accordance with this method. The resulting zinc salicylate is believed to have the following structural formula (A):

(Ka-3)

(A)

According to Japanese Unexamined Patent Publication No. 127726/1978, a methanol solution of 3,5-di-tertbutylsalicylic acid and an aqueous solution of $Cr_2(SO_4)_3$ are mixed, the pH is adjusted to a level of from 4 to 5 by an aqueous sodium hydroxide solution, followed by refluxing to obtain a chromium complex as slightly green precipitate. In a case of other aromatic carboxylic acid or other metal such as cobalt, nickel or iron, the desired compound may be prepared in accordance with this method. The resulting chromium complex of 3,5-di-tertbutylsalicylic acid, is believed to have the following structural formula (B):

(Ka-4)

-continued

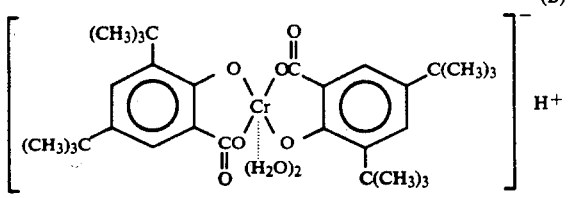

The metal complex and/or the metal salt of an aromatic carboxylic acid of the above formula (I) is doped in an aromatic amine compound or a hydrazone compound as host material, to form an organic hole injection transport layer 3. In this case, the amount of the metal complex and/or the metal salt of an organic carboxylic acid to be doped in the host material, is preferably from $10^{-3}$ to 10 mol %. The region to be doped may be the entire region of the organic hole injection transport layer or a part thereof.

The organic hole injection transport layer 3 containing such a metal complex and/or a metal salt of an aromatic carboxylic acid, is formed on the abovementioned conductive layer 2a by a coating method or a vacuum deposition method.

In the case of coating, a coating solution is prepared by adding and dissolving one or more organic hole injection transport compounds, the metal complex and/or the metal salt of an aromatic carboxylic acid of the above formula (I) and, if necessary, a binder resin which will not trap holes and an additive such as a coating property-improving agent such as a leveling agent, and the coating solution is applied on the conductive layer 2a by a method such as a spin coating method, followed by drying to form the organic hole injection transport layer 3. As the binder resin, a polycarbonate, a polyarylate or a polyester may, for example, be mentioned. If the amount of the binder resin is large, the hole mobility tends to decrease. Therefore, the smaller the amount of the binder resin, the better. The amount is preferably at most 50% by weight relative to the coating solution.

In the case of the vacuum deposition method, the organic hole injection transport compound is put into a crucible placed in a vacuum chamber, the metal complex and/or the metal salt of an aromatic carboxylic acid of the above formula (I) is put in another crucible, then the vacuum chamber is evacuated to a level of $10^{-6}$ Torr by a suitable vacuum pump, and the respective crucibles are heated simultaneously to evaporate the contents and to form a layer on a substrate disposed to face the crucibles. Otherwise, the above materials are preliminarily mixed, and the mixture is put into a single common crucible, followed by evaporation.

As the organic hole injection transport compound, an aromatic amine compound or a hydrazone compound which will be described hereinafter, may be employed.

In the present invention, the thickness of the organic hole injection transport layer 3 is usually from 100 to 3,000 Å, preferably from 300 to 1,000 Å. A vacuum deposition method is preferably employed usually to form such a thin film uniformly.

An organic luminescent layer 4 is formed on the organic hole injection transport layer 3. Such an organic luminescent layer 4 is desired to be capable of transporting electrons from the cathode efficiently towards the organic hole injection transport layer between the electrodes to which an electric field is applied. Accordingly, the compound to be used for the organic luminescent layer 4 is required to be a compound having a high efficiency for injection of electrons from the conductive layer 2b and which is capable of efficiently transporting the injected electrons. For this purpose, it is required to be a compound having a high electron affinity, large electron mobility and excellent stability and which scarcely forms impurities during the production or use, which are likely to form traps.

As materials satisfying these conditions, an aromatic compound such as tetraphenylbutadiene (Japanese Unexamined Patent Publication No. 51781/1982), a metal complex such as an aluminum complex of 8-hydroxyquinoline (Japanese Unexamined Patent Publication No. 194393/1984), a cyclopentadiene derivative (Japanese Unexamined Patent Publication No. 289675/1990), a perinone derivative (Japanese Unexamined Patent Publication No. 289676/1990), an oxadiazole derivative (Japanese Unexamined Patent Publication No. 216791/1990), a bisstyrylbenzene derivative (Japanese Unexamined Patent Publication No. 245087/1989 or No. 222484/1990), a perylene derivative (Japanese Unexamined Patent Publication No. 189890/1990 or No. 791/1991), a coumarin compound (Japanese Unexamined Patent Publication No. 191694/1990 or No. 792/1991), a rare earth complex (Japanese Unexamined Patent Publication No. 256584/1989), and a distyrylpyrazine derivative (Japanese Unexamined Patent Publication No. 252793/1991) may be mentioned. When these compounds are employed, the organic luminescent layer simultaneously plays a role of transporting electrons and a role of emitting light upon recombination of holes and electrons.

For the purpose of improving the luminous efficiency of the organic electroluminescent device and modifying the luminescent color, it has been common to dope various fluorescent dyes into the organic fluorescent layer (U.S. Pat. No. 4,769,292). This method has the following merits:

① The luminous efficiency can be improved by the fluorescent dye with high efficiency.
② By selecting the fluorescent dye, the wavelength of light to be emitted can be selected.
③ It is possible to employ even a fluorescent dye which undergoes concentration quenching.
④ It is possible to employ even a fluorescent dye which is poor in the film-forming property.

This method is useful for the present invention.

In the present invention, the thickness of the organic luminescent layer 4 is usually from 30 to 2,000 Å, preferably from 100 to 1,000 Å. Such an organic luminescent layer 4 may be formed by the same method as used for the formation of the organic hole injection transport layer. However, a vacuum deposition method is usually employed.

Figure 2:
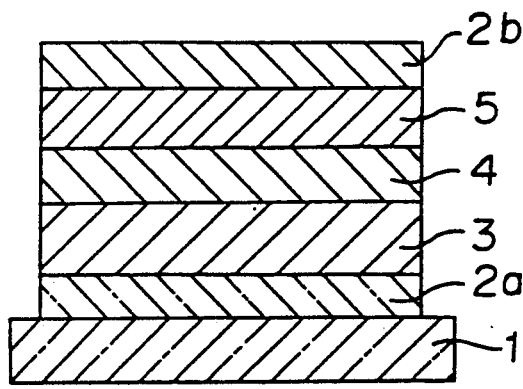
FIG. 2 is a cross sectional view showing another embodiment of the organic electroluminescent device of the present invention.

In the present invention, the structure of a device as shown in FIG. 2 may be employed in order to further improve the luminous efficiency of the organic electroluminescent device. In the organic electroluminescent device shown in FIG. 2, the organic luminescent layer 4 may be made of the above-mentioned material for the organic luminescent layer, and an organic electron injection transport layer 5 is further deposited thereon. A compound to be used for this organic electron injection transport layer 5 is required to be such that injection of electrons from the cathode is easy, and the ability of transporting electrons is large. As such an organic electron injection transport material, a nitro-substituted fluorenone derivative such as a compound of the formula ka-5, a thiopyrandioxide derivative such as a compound of the formula ka-6, a diphenylquinone derivative such as a compound of the formula ka-7, a perylene tetracarboxylic acid derivative such as a compound of the formula ka-8 (Jpn. J. Appl. Phys., Vol. 27, L269, 1988), or an oxadiazole derivative such as a compound of the formula ka-9 (Appl. Phys. Lett. Vol. 55, p1489, 1980), may be mentioned.

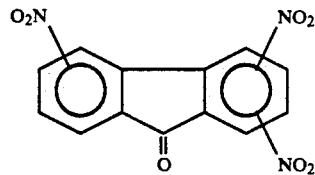
(Ka-5)

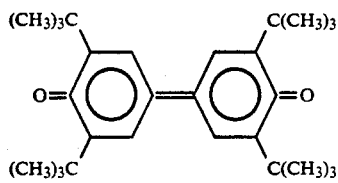
(Ka-6)

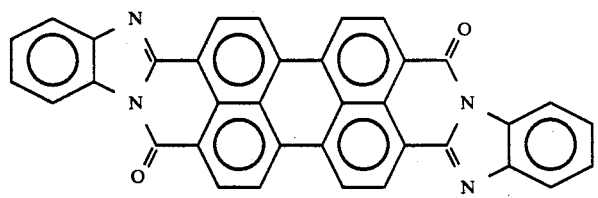
(Ka-7)

(Ka-8)

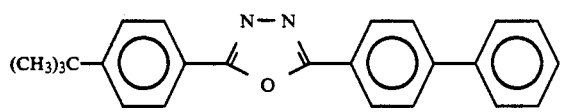
(Ka-9)

The thickness of such an organic electron injection transport layer 5 is usually from 100 to 2,000 Å, preferably from 300 to 1,000 Å.

Further, in the present invention, a structure opposite to the one shown in FIG. 1 may be adopted. Namely, it is possible to adopt a structure in which a conductive layer 2b, an organic luminescent layer 4, an organic hole injection transport layer 3 and a conductive layer 2a are formed on the substrate in this order. As described above, it is also possible to provide the electroluminescent device of the present invention between two substrates, at least one of which has high transparency. Likewise, it is also possible to adopt a structure opposite to the one shown in FIG. 2, i.e. a structure wherein a conductive layer 2b, an organic electron injection transport layer 5, an organic luminescent layer 4, an organic hole injection transport layer 3 and a conductive layer 2a are sequentially formed on the substrate in this order.

In general, there exists a hole injection barrier between the conductive layer 2a and the organic hole injection transport layer 3, and this injection barrier is defined as a difference between the ionization potential of the organic hole injection transport layer 3 and the work function of the conductive layer 2a. For the conductive layer 2a, indium-tin oxide (hereinafter referred to simply as "ITO") is usually employed. The work function of commercially available ITO glass (NA-40 glass manufactured by HOYA K. K., ITO film thickness: 1,200 Å) is at a level of 4.70 eV. In the present invention, measurement of the work function (the ionization potential) was conducted by an ultraviolet photoelectron analyzer (AC-1 Model) manufactured by Riken Keiki K. K.

On the other hand, the above-mentioned N,N'-diphenyl-N,N'-(3-methylphenyl)-1,1'-biphenyl-4,4'-diamine (hereinafter referred to simply as "TPD") (Jpn. J. Appl. Phys., Vol. 27, L269, 1988) being an aromatic diamine used to be employed for an organic hole injection transport layer, has a structure of the following formula ka-10. This compound was formed into a thin film by vacuum deposition, and its ionization potential was measured in the same manner by AC-1 and found to be 5.23 eV. Thus, the hole injection barrier in this case is considered to be 0.53 eV.

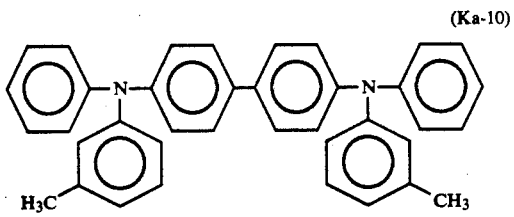
(Ka-10)

As described above, the ionization potential of the aromatic diamine and the hydrazone compound is usually within a range of from 5.2 to 5.5 eV, whereby it requires a high electric field to overcome the hole injection barrier. Further, a voltage drop occurs at the interface of anode/organic hole injection transport layer, whereby Joule heating is localized at the interface during the operation of the device, thus causing instability or deterioration of the operation of the device.

The above aromatic diamine or hydrazone compound is an insulator by itself and is believed to have no intrinsic carrier, unless a carrier is injected from an electrode.

In the present invention, by using the metal complex and/or the metal salt of an organic carboxylic acid as a doping material for the organic hole injection transport layer of an organic electroluminescent device, formation of a carrier is made possible without injection from an electrode, whereby excellent luminescent characteristics, particularly a reduction of the driving voltage, can be accomplished.

DESCRIPTION OF THE PREFERRED EMBODIMENTS

Now, the present invention will be described in further detail with reference to Examples and Comparative Examples. However, it should be understood that the present invention is by no means restricted to such specific Examples.

EXAMPLES 1 AND 2

Organic electroluminescent devices having the structure as shown in FIG. 1, were prepared by a following method.

A transparent conductive film of indium-tin oxide (ITO) formed on a glass substrate in a thickness of 1,200 Å, was washed with water and further subjected to ultrasonic cleaning with isopropyl alcohol. Then, the coated substrate was placed in a vacuum deposition apparatus, and the apparatus was evacuated by an oil diffusion pump until the pressure in the apparatus became not more than $2 \times 10^{-6}$ Torr. A mixture of the following hydrazone compounds (H1) and (H2) in a molar ratio of (H1):(H2)=1:0.3, as materials for the organic hole injection transport layer, and an aluminum salt of the aromatic carboxylic acid of the above formula ka-8 as a compound to be doped, were placed in separate crucibles, and vapor deposition was conducted by heating the crucibles simultaneously by a tantalum wire heater disposed around the crucibles.

(Ka-11)
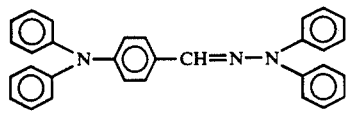

(H1)

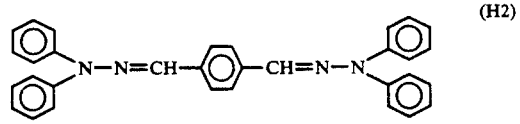
(H2)

The temperatures of the respective crucibles were controlled so that the temperature for the hydrazone mixture was within a range of from 230° to 240° C., and the temperature for the aluminum salt of the aromatic carboxylic acid (8) of the formula ka-1 was 160° C. The pressure during the vacuum deposition was $2 \times 10^{-7}$ Torr, and the time for the vacuum deposition was two minutes and 30 seconds. As a result, an organic hole injection transport layer having a thickness of 515 Å and having the aluminum salt of the aromatic carboxylic acid (8) of the formula ka-1 doped in an amount of 2.3 mol %, was obtained.

Then, as material for an organic fluorescent layer, a 8-hydroxyquinoline complex of aluminum $Al(C_9H_6NO)_3$ having the following structural formula was vacuum-deposited in the same manner to form a layer on the organic hole injection transport layer.

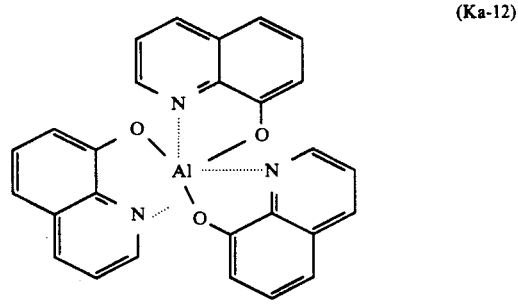
(Ka-12)

The temperature of the crucible was controlled to be 280° C., and the pressure during the vacuum deposition was $5 \times 10^{-7}$ Torr, and the time for the vacuum deposition was two minutes. Thus, an organic luminescent layer 4 having a thickness of 520 Å was obtained.

Finally, as the cathode, an alloy electrode of magnesium and silver was formed by vacuum deposition in a film thickness of 1,500 Å coevaporation vapor deposition method. For the vacuum deposition, a molybdenum boat was employed, the pressure was $8 \times 10^{-6}$ Torr, and the time for the vacuum deposition was 8 minutes. As a result, a glossy film was obtained. The atomic ratio of magnesium to silver was within a range of from 10:1 to 10:2.

Thus, an organic electroluminescent device A was prepared

Further, an organic electroluminescent device B was prepared in the same manner as the device A except that the concentration of the aluminum salt of the aromatic carboxylic acid (8) of the formula ka-1 in the organic hole injection transport layer was changed to 7.4 mol %.

Figure 3:
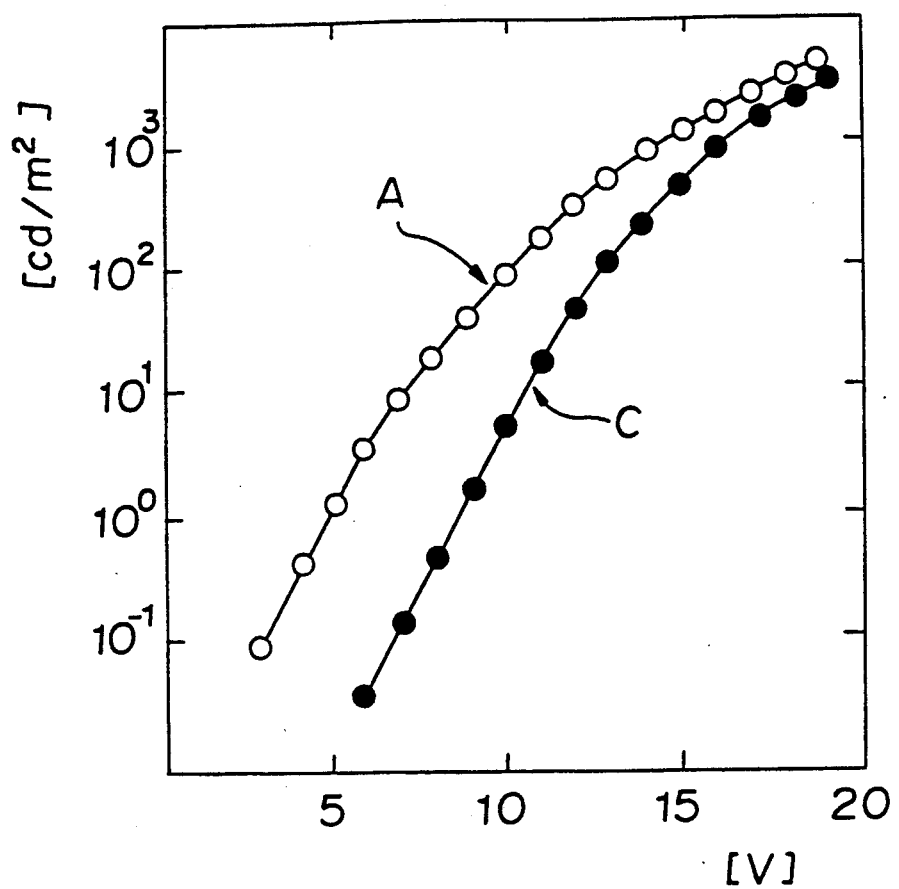
FIG. 3 is a graph showing the luminance-voltage characteristics of devices A and C.
Figure 4:
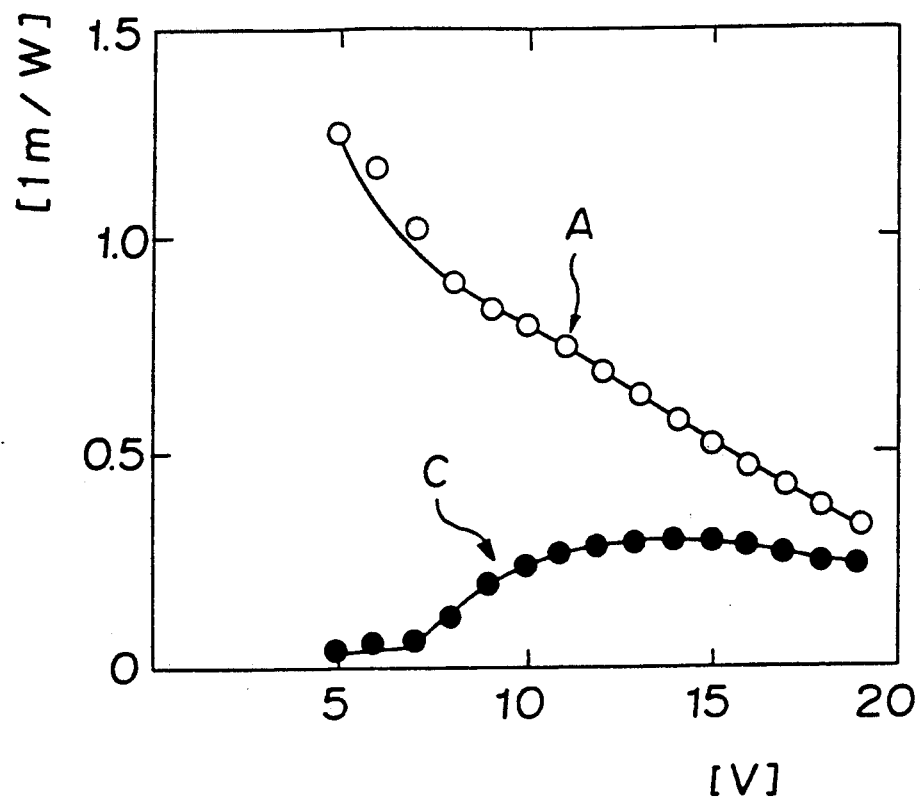
FIG. 4 is a graph showing the luminous efficiency-voltage characteristics of devices A and C.

The luminescent characteristics were measured by applying a direct current positive voltage to the ITO electrode (anode) and a direct current negative voltage to the magnesium-silver electrode (cathode) of the organic electroluminescent devices A and B thus obtained, and the results are shown in Table 1. Further, the luminance-voltage characteristics of the device A are shown in FIG. 3, and the luminous efficiency-voltage characteristics are shown in FIG. 4.

The emission spectra of these devices A and B showed uniform green emission over from 500 to 600 nm.

In Table 1, Vth indicates a voltage at which the luminance becomes 1 cd/m², the luminous efficiency is an efficiency at $V_{100}$, and $V_{100}$ indicates a voltage at which the luminance becomes 100 cd/m².

COMPARATIVE EXAMPLE 1

An organic electroluminescent device C was prepared in the same manner as in Example 1 except that no doping was conducted to the organic hole injection transport layer. The luminescent characteristics of this device were measured, and the results are shown in Table 1. Further, the luminance-voltage characteristics of this device C are shown in FIG. 3, and the luminous efficiency-voltage characteristics are shown in FIG. 4. From these results, it is evident that with the device C, the driving voltage is high and the luminous efficiency is low as compared with the device A of Example 1. The luminescent spectrum of this device C was the same as in Example 1.

EXAMPLE 3

An organic electroluminescent device D was prepared in the same manner as in Example 1 except that 1.4 mol part of a zinc salt of the aromatic carboxylic acid (8) of the formula ka-1 was doped in the organic hole injection transport layer. The luminescent characteristics of this device are shown in Table 1.

EXAMPLE 4

An organic electroluminescent device E was prepared in the same manner as in Example 1 except that the organic hole injection transport layer was formed by doping 3.0 mol % of an aluminum salt of the aromatic carboxylic acid (8) of the formula ka-1 in a host material prepared by mixing the following aromatic diamine compounds (H3) and (H4) in a molar ratio of (H3):(H4) = 1:0.5 as material for the organic hole injection transport layer. The luminescent characteristics of this device are shown in Table 1.

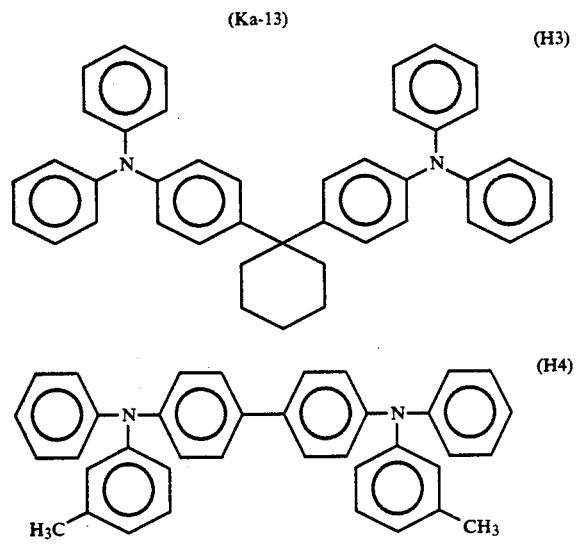

(Ka-13)

(H3)

(H4)

COMPARATIVE EXAMPLE 4

An organic electroluminescent device F was prepared in the same manner as in Example 3 except that no doping was conducted to the organic hole injection transport layer. The luminescent characteristics of this device were measured, and the results are shown in Table 1. From Table 1, it is evident that with the device F, the driving voltage is high and the luminous efficiency is low as compared with the device E of Example 4.

TABLE 1

| Example No. | Device | Vth (V) | Maximum luminance (cd/m²) | Luminous efficiency lm/W | $V_{100}$ (V) |
| --- | --- | --- | --- | --- | --- |
| Example 1 | A | 5 | 3878 | 0.80 | 10 |
| Example 2 | B | 5 | 3240 | 0.29 | 10 |
| Comparative Example 1 | C | 9 | 2996 | 0.29 | 13 |
| Example 3 | D | 7 | 3587 | 0.45 | 11 |
| Example 4 | E | 8 | 5399 | 0.27 | 12 |
| Comparative Example 2 | F | 13 | 5178 | 0.14 | 17 |

As described in detail in the foregoing, the organic electroluminescent device of the present invention has an anode, an organic hole injection transport layer, an organic luminescent layer and a cathode sequentially formed on a substrate in this order, and a certain specific compound is incorporated to the organic hole injection transport layer, whereby when voltage is applied to both electrodes, a light emission with practically sufficient luminance can be obtained at a low driving voltage.

The electroluminescent device of the present invention is useful in the field of flat panel displays (such as a wall-hanging television) or may be applied to a light source utilizing a spontaneous light-emitter (such as a light source for a copying machine, or a backlight light source for liquid crystal displays or meters), a display board or a beacon light. Thus, its industrial usefulness is significant.

We claim:

1. In an organic electroluminescent device having an anode, an organic hole injection transport layer as host material, an organic luminescent layer and a cathode formed sequentially in this order, the improvement wherein the organic hole injection transport layer contains a metal complex and/or a metal salt of an aromatic carboxylic acid.

2. The organic electroluminescent device according to claim 1, wherein the organic hole injection transport layer comprises an aromatic amine compound or a hydrazone compound as host material and from $10^{-3}$ to 10 mol %, based on the host material, of the metal complex and/or the metal salt of an aromatic carboxylic acid doped in the host material.

3. The organic electroluminescent device according to claim 1, wherein the aromatic carboxylic acid is a compound of the formula (I):

$$ArCOOH \qquad (I)$$

wherein Ar is a substituted or unsubstituted aromatic ring or aromatic heterocyclic ring residue.

4. The organic electroluminescent device according to claim 3, wherein Ar in the formula (I) is a benzene, naphthalene, anthracene or carbazole ring residue which may be substituted by an alkyl group, an aryl group, a hydroxyl group, an alkoxy group, an aryloxy group, an alkylcarbonyl group, an arylcarbonyl group, an alkoxycarbonyl group, an aryloxycarbonyl group, a carboxyl group, a nitro group, a cyano group or a halogen atom.

5. The organic electroluminescent device according to claim 1, wherein the metal for the metal complex and/or the metal salt of an aromatic carboxylic acid is Al, Zn, Cr, Co, Ni or Fe.

6. The organic electroluminescent device according to claim 1, wherein the anode is made of a metal such as an aluminum, gold, silver, nickel, palladium or tellurium, a metal oxide such as indium and/or tin oxide, copper iodide, carbon black, or a conductive resin such as poly(3-methylthiophene), and the cathode is made of a metal such as tin, magnesium, indium, aluminum or silver, or an alloy thereof.

7. The organic electroluminescent device according to claim 2, wherein the aromatic amine compound is N,N'-diphenyl-N,N'-(3-methylphenyl)-1,1'-biphenyl-4,4'-diamine, 1,1'-bis(4-di-p-tolylaminophenyl)cyclohexane, or 4,4'-bis(diphenylamino)quadrophenyl.

8. The organic electroluminescent device according to claim 1, wherein the organic luminescent layer contains tetraphenylbutadiene, an aluminum complex of 8-hydroxyquinoline, a cyclopentadiene derivative, a perinone derivative, an oxadiazole derivative, a bisstyrylbenzene derivative, a perylene derivative, a coumarin compound, a rare earth complex, or a distyrylpyrazine derivative.

9. The organic electroluminescent device according to claim 1, wherein the anode has a thickness of from 50 to 1,000 Å, the cathode has a thickness of from 50 to 10,000 Å, the organic hole injection transport layer has a thickness of from 100 to 3,000 Å, and the organic luminescent layer has a thickness of from 30 to 2,000 Å.

10. The organic electroluminescent device according to claim 1, wherein at least one of the anode and the cathode has a thickness of from 100 to 5,000 Å.

11. The organic electroluminescent device according to claim 1, wherein an organic electron injection transport layer having a thickness of from 100 to 2,000 Å is interposed between the organic luminescent layer and the cathode.

* * * * *